United States Patent [19]
Engh

[11] Patent Number: 5,877,984
[45] Date of Patent: Mar. 2, 1999

[54] METHOD AND APPARATUS FOR ADJUSTMENT AND CONTROL OF AN ITERATIVE METHOD OF RECORDING ANALOG SIGNALS WITH ON CHIP SELECTION OF A VOLTAGE RAMP AMPLITUDE

[75] Inventor: Lawrence D. Engh, Redwood City, Calif.

[73] Assignee: Information Storage Devices, Inc., San Jose, Calif.

[21] Appl. No.: 924,397

[22] Filed: Sep. 5, 1997

[51] Int. Cl.[6] .................................................. G11C 16/04
[52] U.S. Cl. ........................................ 365/185.19; 365/45
[58] Field of Search ......................... 365/185.03, 185.19, 365/185.01, 149, 45

[56] References Cited

U.S. PATENT DOCUMENTS

| | | | |
|---|---|---|---|
| 4,989,170 | 1/1991 | Simko ................................ | 365/185.03 |
| 5,220,531 | 6/1993 | Blyth et al. . | |
| 5,241,494 | 8/1993 | Blyth Ed Al. ..................... | 365/185.03 |
| 5,623,436 | 4/1997 | Sowards et al. . | |
| 5,629,890 | 5/1997 | Engh . | |
| 5,659,505 | 8/1997 | Kobayashi et al. ................ | 365/185.29 |
| 5,668,756 | 9/1997 | Tomioka ............................ | 365/185.29 |

*Primary Examiner*—David Nelms
*Assistant Examiner*—Thong Le
*Attorney, Agent, or Firm*—Blakely, Sokoloff, Taylor & Zafman LLP

[57] ABSTRACT

A circuit and method for adjusting the ramp voltage applied to a control gate of a non-volatile memory cell to improve programming accuracy. The method involves measuring an amount of additional voltage realized at a source of the floating gate transistor. Thereafter, a preset compensation ratio may be selected to reduce a ramp voltage applied to the control gate of the memory cell by an amount necessary to lessen the amount of additional voltage realized at the source of the floating gate transistor. This will reduce inaccurate measurement of voltages during the read-while-write voltage program technique. A voltage control circuit is connected to the control gate for precise reduction of the ramp voltage.

21 Claims, 5 Drawing Sheets

METHOD AND APPARATUS FOR ADJUSTMENT AND CONTROL OF AN ITERATIVE METHOD OF RECORDING ANALOG SIGNALS WITH ON CHIP SELECTION OF A VOLTAGE RAMP AMPLITUDE

BACKGROUND OF THE INVENTION

1. Field of the Invention

The present invention relates to the field of analog storage devices. More particularly, this invention relates to a circuit and method for adjusting the voltage applied to a gate of a non-volatile memory cell to improve programming accuracy.

2. Description of Prior Art

Currently, various analog storage devices are designed with circuitry used to program non-volatile (NV) memory cells of a memory array such as Electrically Erasable Programmable Read Only Memory (EEPROM) cells. Cell programming may be accomplished by applying programming voltage to a drain of a targeted EEPROM cell in accordance to a read-while-writing voltage program technique of U.S. Pat. No. 5,629,890.

U.S. Pat. No. 5,629,890 describes the read-while-writing voltage program technique in which a voltage present on a source terminal of the EEPROM cell is provided to a comparator and compared with a selected target voltage. The selected target voltage is a slightly reduced voltage sampled from an input analog signal. So long as the selected target voltage is greater than the source voltage of the EEPROM cell, a high voltage ramp is supplied to the EEPROM cell. Once the selected target voltage has been reached, the supply of the high voltage ramp to the EEPROM cell is discontinued and a new voltage is calculated and loaded into the comparator to continue programming as needed.

It is well known that the exact electrical characteristics of NV memories, may vary in production due to variations in fabrication. For example, the coupling ratio tends to vary for EEPROM cells. The "coupling ratio" is a ratio of (i) the capacitance between a floating gate and a drain terminal of the floating gate transistor and (ii) the capacitance between the floating gate and a control gate. While the read-while-write voltage program technique tolerates many electrical characteristic variations, it remains vulnerable to variations in the coupling ratio. Such vulnerability occurs when a predetermined, generally constant voltage is applied to the control gate.

More specifically, as greater voltage is applied to the drain terminal of the floating gate transistor, this inadvertently causes an increase in voltage at the source terminal (source voltage). Since this source voltage is measured during the read-while-write voltage program technique to detect when to discontinue programming of the EEPROM cell, cell programming may be discontinued prematurely causing the EEPROM cell to be under-programmed. During a normal read operation, when the difference between the selected target voltage and the voltage of the EEPROM cell is determined in order to calculate a new target voltage, this new target voltage will be artificially large, not a small incremental voltage as intended. In fact, since the programming of EEPROM cells is an iterative process, the source voltage measured during the read-while-write voltage program technique will become impractically large where the target voltage can be greater than the supply voltage provided by a power supply.

Since variations in EEPROM fabrication techniques cause variation in capacitive coupling between the floating gate and the drain terminal, a standard adjustment of voltage applied to the control gate may cause inaccurate programming of EEPROM cells in certain situations. For multi-level analog voice applications, reduced accuracy appears as noise or distortion. For multi-level voltage used for digital storage, this reduced accuracy causes either errors or a reduction in the number of distinct levels which can be used per EEPROM cell. As a result, it would be desirable to develop and implement a voltage control circuit to control the compensation of ramp voltage applied to the control gate to mitigate undesirable changes in source voltage.

SUMMARY OF THE INVENTION

The present invention relates to a circuit and method for adjusting ramp voltage applied to the gate of a non-volatile memory cell to improve programming accuracy caused by a voltage applied to the drain of the non-volatile memory. This can be accomplished by measuring an amount of additional voltage realized at a source of the floating gate transistor. Thereafter, a compensation ratio may be selected to reduce an amplitude of the ramp voltage applied to a control gate of the memory cell by an amount necessary to lessen the amount of additional voltage realized at the source of the floating gate transistor. This will reduce inaccurate measurement of voltages during the read-while-write voltage program technique.

BRIEF DESCRIPTION OF THE DRAWINGS

The features and advantages of the present invention will become apparent from the following detailed description of the present invention in which.

DESCRIPTION OF THE PREFERRED EMBODIMENT

In the following description, for purposes of explanation, specific details are set forth in order to provide a thorough understanding of the present invention. However, it will be apparent to one skilled in the art of circuit design that the present invention may be practiced without these specific details. In other instances, well known devices and operations may not be shown in order to avoid obscuring the present invention.

Herein, a number of terms are used to describe characteristics of the present invention. For example, the term "HIGH" is defined herein as providing sufficient voltage to turn-on a transistor. The term "LOW" is defined as providing sufficient voltage to turn-off a transistor. "Impedance" is generally defined as a measure of either resistance, capacitance or inductance.

Figure 1:
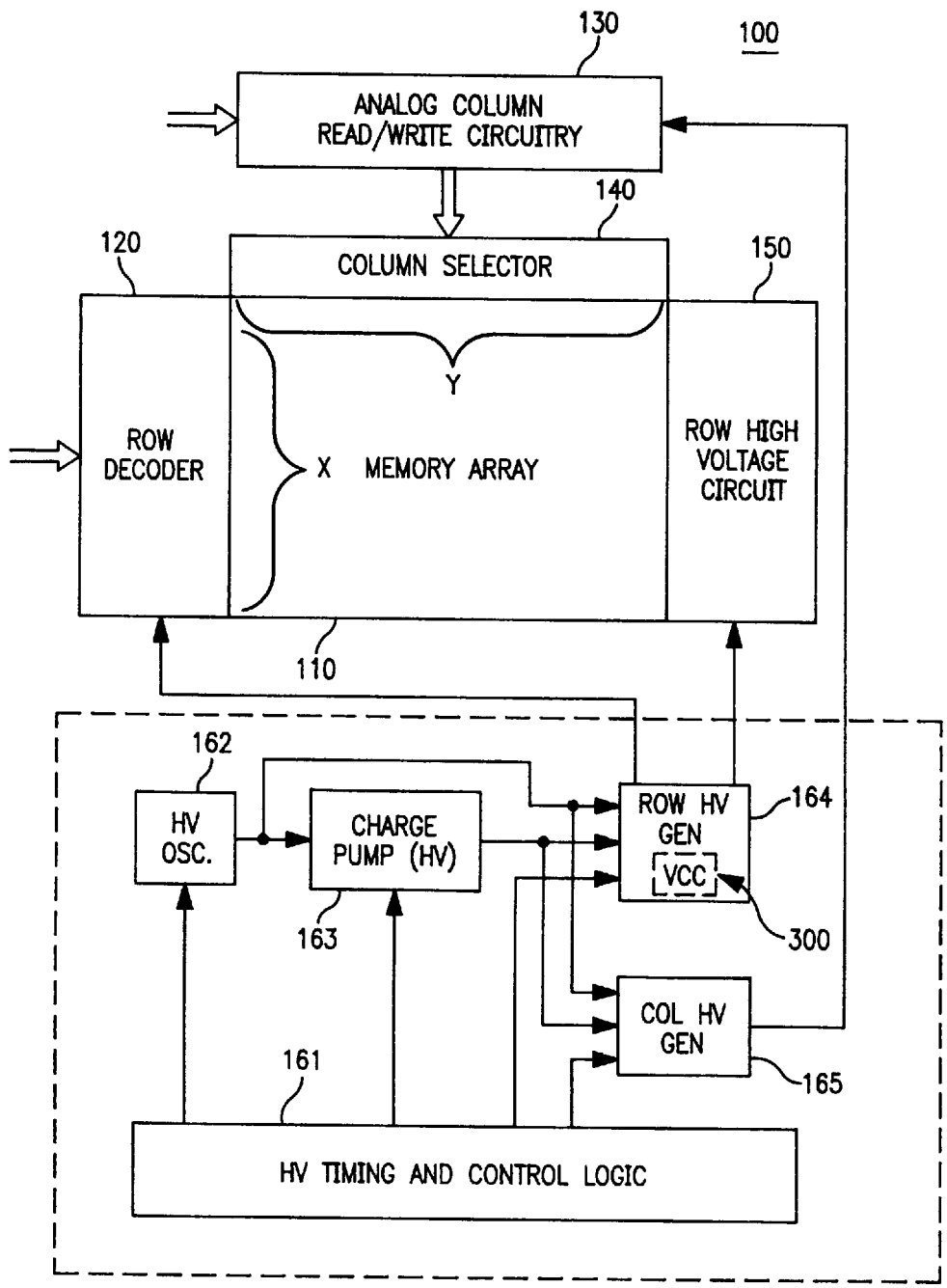
FIG. 1 is an illustrative block diagram of an analog integrated circuit storage device implemented with a voltage control circuit.

Referring to FIG. 1, an illustrative embodiment of an analog integrated circuit (IC) storage device utilizing the present invention is illustrated. The analog IC storage device 100 comprises a memory array 110 interconnected to a (i) row decoder 120, (ii) analog column read/write circuitry 130 and a column selector 140, and (iii) a row high voltage circuit 150. Central to the analog IC storage device 100, memory array 110 has "X" rows and "Y" columns of non-volatile (NV) memory cells, where "X" and "Y" are positive whole numbers. In this embodiment, memory array 110 includes a plurality of electrically erasable programmable read only memory (EEPROM) cells which are arranged in rows and columns and are accessed under any chosen addressing scheme such as page mode addressing. For clarity sake, this discussion will focus on the NV memory cells as EEPROM cells; however, it is contemplated that any other type of non-volatile memory may be used in lieu of EEPROM cells.

A high voltage generator circuit 160 generates and applies a ramp voltage to row decoder 120 and row high voltage circuit 150. High voltage generator circuit 160 includes high voltage timing and logic circuit 161 coupled to a high voltage oscillator 162, a charge pump 163, a row high voltage generator 164 and a column high voltage generator 165. The timing and logic circuit 161 provides timing signals used for programming and erasing purposes. High voltage oscillator 162 is coupled to charge pump 163, row high voltage generator 164 and to column high voltage generator 165 for clocking. More specific to the present invention, charge pump 163 applies a voltage to both row high voltage generator 164 and column high voltage generator 165. Row high voltage generator 164 includes a voltage control circuit 300 which controls a voltage ramp and amplitude (referred to as Clear Low Voltage "CLRLV") provided to row high voltage circuit 150. CLRLV is applied to a control gate of a floating gate transistor of EEPROM cell shown in FIG. 2.

Figure 2:
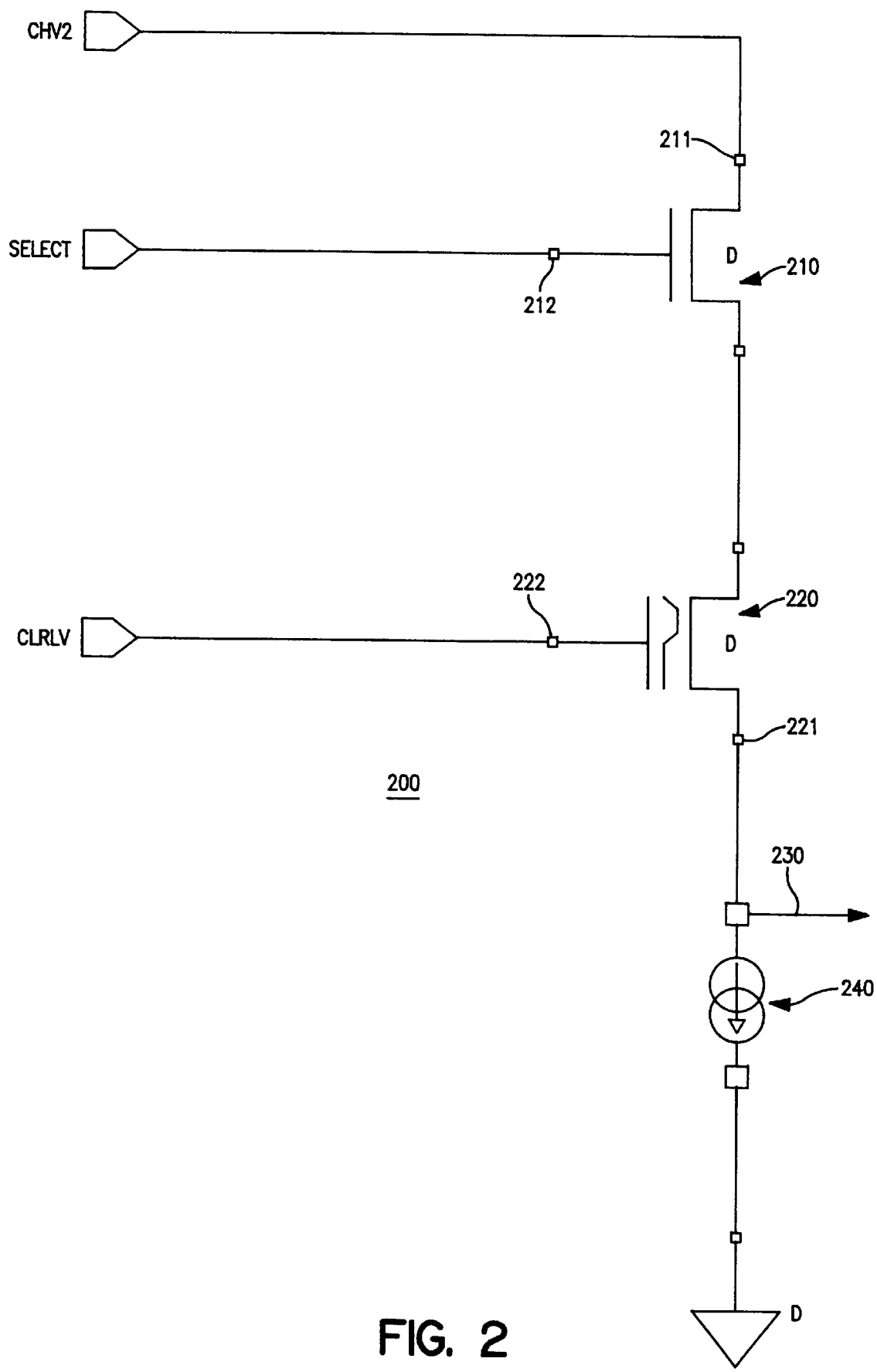
FIG. 2 is a schematic diagram of an EEPROM cell having a floating gate transistor in which the control gate receives a voltage from the voltage control circuit of FIG. 1.

Referring now to FIG. 2, a description of the read-while-write voltage program technique performed on an EEPROM cell 200 of memory array 110 of FIG. 1 is shown. EEPROM cell 200 includes a first transistor 210 and a second 220 which is a floating gate transistor. A high voltage ramp (CHV2) is applied to a source 211 of transistor 210. Representing that the row of EEPROM cell 200 has been selected, a select signal is applied to gate 212. When EEPROM cell 200 is targeted for programming, the select signal is set to a high voltage (e.g., greater than a maximum voltage of CHV2 by a threshold voltage drop). A "read-while-write" voltage line 230 is connected from a drain 221 of transistor 220 which is also connected to a current source 240.

During a write operation, CHV2 is applied to source 211 of transistor 210 and transistor 210 is turned-on. Subsequently, the read-while-write voltage is detected at drain 221 of transistor 220. Thus, the apparent voltage level of EEPROM cell 200 is detected while the voltage level of EEPROM cell 200 is still being set. Transistor 220 receives the clear signal (CLRLV) at its control gate 222 which is a low voltage used to control an EEPROM cell without causing permanent change to the stored voltage. This CLRLV signal improves the accuracy of the read-while-write voltage line 230.

Figure 3:
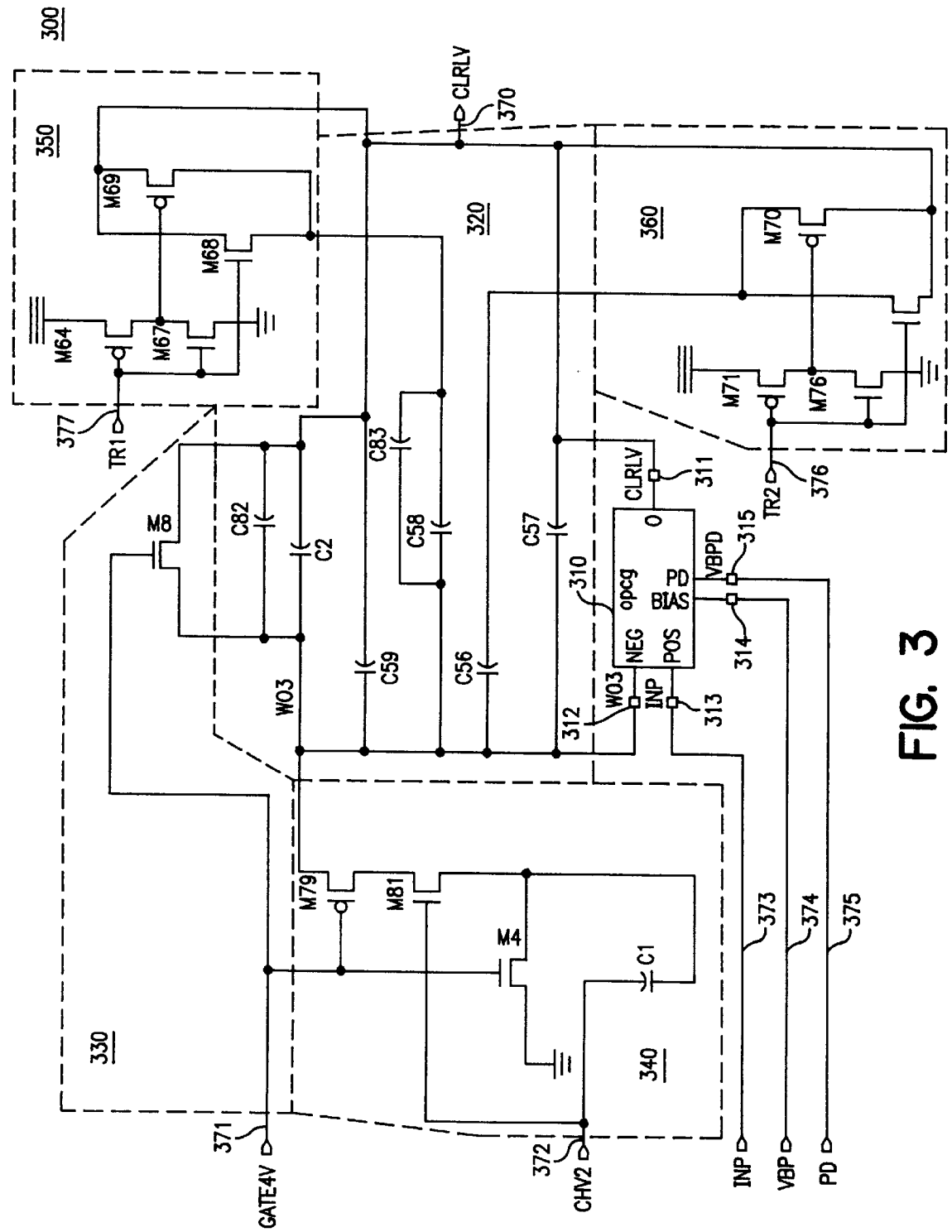
FIG. 3 is an illustrative circuit schematic of the voltage control circuit of FIG. 1.

Referring now to FIG. 3, an illustrative embodiment of the voltage control circuit 300 is shown. Voltage control circuit 300 includes an (operational) amplifier 310, a programmable feedback circuit 320, a reset circuit 330, a select circuit 340 and a plurality of programming circuits 350 and 360. Voltage control circuit 300 further includes (i) an output signal line 370 connected to an output 311 of amplifier 310 and (ii) a plurality of input signal lines 371–377.

The output signal line 370 provides CLRLV to row high voltage circuit 150 of FIG. 1, and in particular, to one or more control gates of corresponding EEPROM cell(s). The inputs corresponding to input signal lines 371–377 include a large swing logic signal (GATE4V), a high voltage ramp (CHV2), a reference voltage (INP), a bias voltage (VBP), a power down voltage (PD), and at least two trim bits (TR1 and TR2), respectively. GATE4V is applied to reset circuit 330 and select circuit 340 to initiate a reset condition for voltage control circuit 300 in response to a normal read operation. Furthermore, the reset and select circuits 330 and 340 are used to route CHV2 (a precise high voltage ramp) into an inverting input 312 of amplifier 310. INP is a constant voltage reference applied to a non-inverting input 313 of amplifier 310. VBP and PD are applied to inputs 314 and 315 of amplifier 310 in order to provide bias voltage to amplifier 310 and to signal amplifier 310 to reduce power consumption when idle.

As further shown in FIG. 3, TR1 and TR2 are used to program the impedance of feedback circuit 320 of amplifier 310. This programmed impedance influences the voltage of CLRLV to follow one of four decreasing (negative) preset compensations having compensation ratios of 2:7, 2:9, 2:11 and 2:13. The "compensation ratio" is generally equivalent to a negative result of the voltage of CLRLV divided by the voltage of CHV2. In this embodiment, this variation of compensation ratios is provided by placing more capacitors in parallel with each other. The capacitance values of capacitors of FIG. 3 are shown in Table A. It is contemplated, however, that resistance could be used to provide the compensation ratios instead of or in combination with capacitance. Of course, the feedback circuit 320 would be slightly altered to support such impedance.

TABLE A

| Capacitor | Picofarads | Capacitor | Picofarads |
|---|---|---|---|
| C1 | 2 | C58 | 2 |
| C2 | 2 | C59 | 2 |
| C56 | 2 | C82 | 2 |
| C57 | 1 | C83 | 2 |

For example, in this embodiment, a voltage increase of CHV2 generally causes a voltage decrease of CLRLV. More specifically, when CHV2 is prevented from being applied to its inverting input 312, amplifier 310 produces a constant voltage for CLRLV. This constant voltage is equivalent to the selected voltage of INP ($V_{inp}$). Once CHV2 is applied to the inverting input 312 of amplifier 310, amplifier 310 produces a decreased voltage based on the feedback capacitance programmed by TR1 and TR2 as described below.

Figure 4:
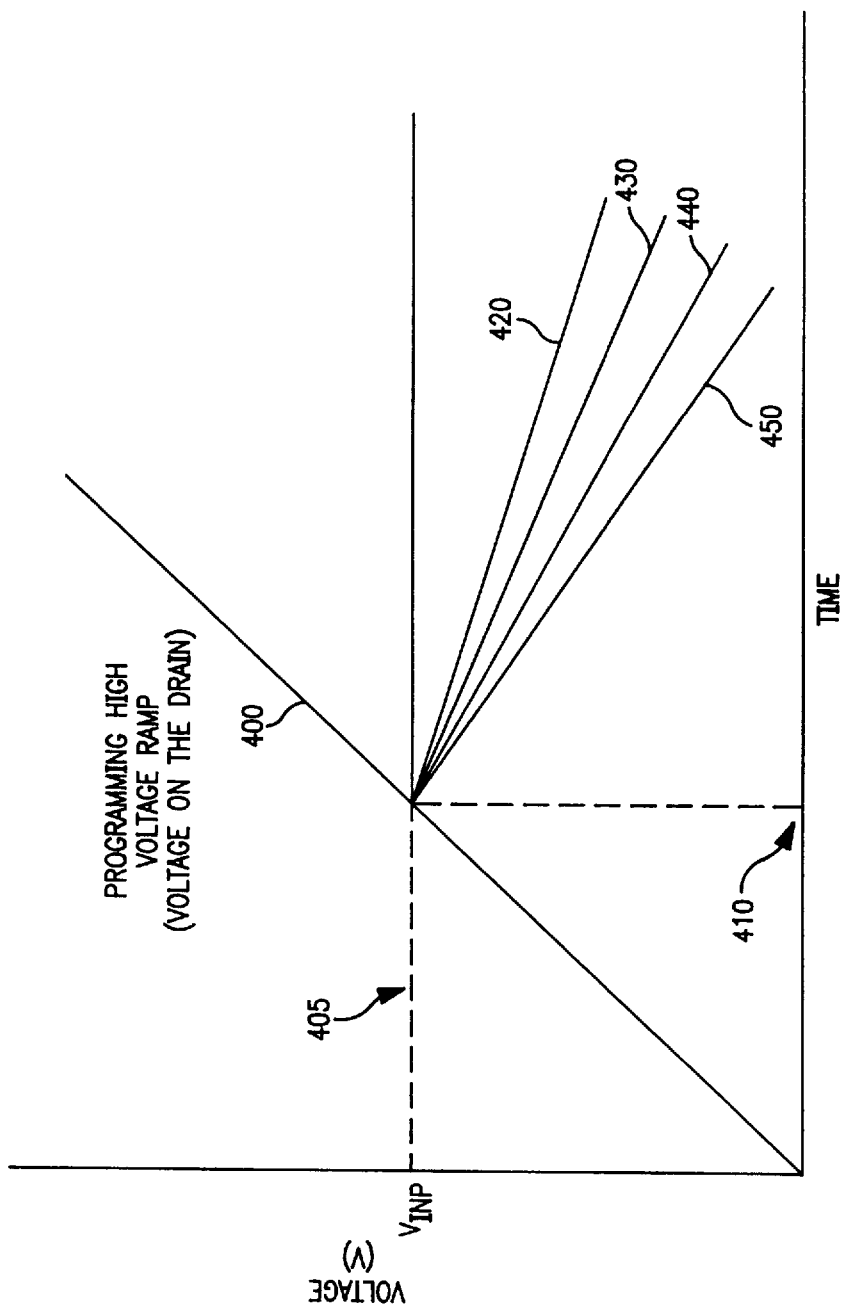
FIG. 4 is an illustrative graphical representation of the relationship between the ramp voltage applied to the EEPROM cell of FIG. 2 and selectable preset compensation ramp voltages applied to the control gate of the EEPROM cell.

Referring to both FIGS. 3–4, the operations of voltage control circuit 300 shown in FIG. 3 are described. During a programming operation, GATE4V is set to a minimal voltage to turn-off transistor M4 of select circuit 340 and to turn-on transistor M79 of select circuit 340. CHV2 begins to increase at a first (positive) ramp rate 400 and to charge capacitor C1 of select circuit 340. The first ramp rate 400 is a design choice such as approximately 1V/µs in this embodiment. Since CHV2 is currently incapable of turning on transistor M81 of select circuit 340, the voltage level of CLRLV 405 initially is maintained at the voltage of INP ($V_{inp}$). In this embodiment, the voltage of INP is equivalent to 3.5 V.

Once CHV2 turns-on transistor M81 of select circuit 340 to electrically connect select circuit 340 to node W03 (represented at time 410 of FIG. 4), CHV2 is applied to inverting input 311 of amplifier 310. As shown, the voltage needed to turn-on transistor M81 is arbitrarily chosen as 3.5 V. This causes a voltage reduction in CLRLV based on the capacitance of feedback circuit 320. In this embodiment, the reduction is in accordance with a decreasing (negative) selectable preset compensation 420, 430, 440 and 450 shown as compensation ratios of 2:7, 2:9, 2:11 and 2:13, respectively. These compensations are based on the particular selection of TR1 and TR2. It is contemplated, however, that more, less or different compensation ratios may be provided in lieu of or in addition to those illustrated.

Referring now to FIG. 3, programming circuit 350 is used to place capacitors C58 and C83 in parallel with capacitors C1, C2, C57 and C59 while programming circuit 360 is used to place capacitor C56 in parallel with capacitors C1, C2, C57 and C59. With respect to programming circuit 350, when TR1 is HIGH, an inverter formed by transistors M64 and M67 turns-on transmission gate (e.g., transistors M68 and M69). This causes the total capacitance provided by capacitor switching unit 320 to increase by the capacitive values associated with capacitors C58 and C83. Otherwise, if TR1 is LOW, transistors M68 and M69 are turned-off, disconnecting capacitors C58 and C83 from parallel capacitors C1, C2, C57 and C59.

With respect to programming circuit 360, when TR2 is HIGH, an inverter formed by transistors M71 and M76 turns-on transistors M70 and M75. This causes the total capacitance provided by capacitor switching unit 320 to increase by the capacitive value associated with capacitor C56. Otherwise, if TR2 is LOW, transistors M70 and M75 are turned-off which disconnects capacitor C56 from parallel capacitors C1, C2, C57 and C59.

Referring still to FIG. 3, the operations of voltage control circuit 300 to undergo a reset condition in response to a normal read operation are described. Initially, GATE4V is set to a voltage sufficient to turn-on transistor M4. This causes capacitor C1 to be discharged. In addition, transistor M79 is turned-off and transistor M8 is turned-on in order to discharge all capacitors C1, C2, C57, C59 (and optionally C58, C83 and/or C56 if TR1 and/or TR2 bits are set) coupled between output line 370 and node W03. Thus, amplifier 310 operates as a voltage follower to hold CLRLV at INP (e.g., 3.5 V) as required by the analog IC storage device 100 of FIG. 1 for performing a normal read operation.

Figure 5A:
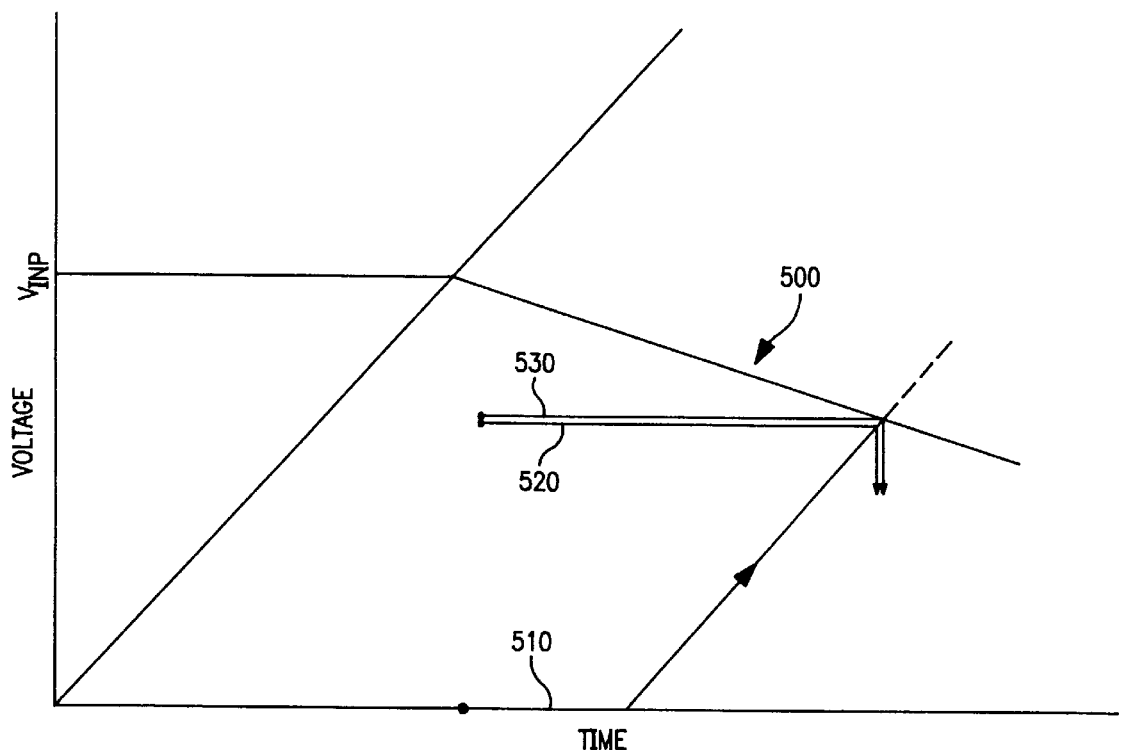
FIGS. 5A and 5B are illustrative graphical representations of the relationship between a selected preset compensation ramp voltage applied to the control gate of the EEPROM cell of FIG. 2 and its corresponding source voltage.
Figure 5B:
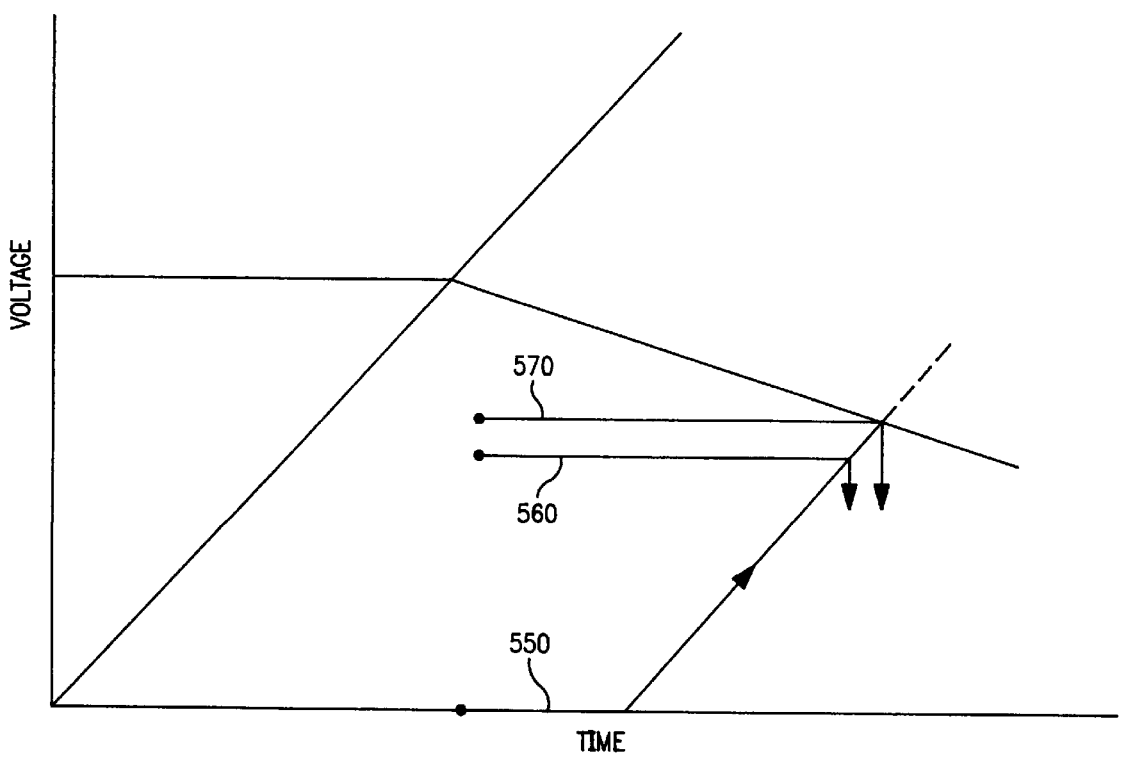

Referring now to FIGS. 5A–5B, illustrative examples of various degrees of compensation are shown. With respect to FIG. 5A, an ideal voltage compensation 500 is provided to output (CLRLV) of voltage control circuit 300 of FIG. 3. This voltage compensation 500 is chosen to negate any additional voltage provided to the source voltage of the EEPROM cell caused by capacitive coupling between the floating gate and drain terminal as described above. Due to capacitive coupling variations of NV memory cells, this would result in unsatisfactory programming accuracy when multiple write cycles are used. For example, a first write cycle 510 would complete programming exactly when the memory cell has been programmed with a selected voltage. For subsequent write cycles (e.g., second and third write cycles 520 and 530), an over programming condition would result because this technique does not account for successive approximation.

However, as shown in FIG. 5B, the application of less voltage compensation 550 in order to mitigate (and not negate) additional voltage provided to source voltage of the EEPROM cell would be preferable for multi-cycle programming. As a result, cell programming is intentionally halted slightly before the initial select voltage has been applied to the EEPROM cell. Thereafter, successive write cycles cause the source voltage to rise incrementally with greater convergence while over-programming is avoided as shown by second and third write cycles 560 and 570 as shown.

The present invention described herein may be designed in many different embodiments evident to one skilled in the art than those described without departing from the spirit and scope of the present invention. For example, although particular exemplary capacitance and voltage have been set forth, principles of the invention may be applied to systems employing different capacitances and utilizing different voltages. The invention should, therefore be measured in terms of the claims which follow.

What is claimed is:

1. A voltage control circuit for enhancing accuracy in programming a memory cell, the voltage control circuit comprising:

an amplifier including an inverting input, a non-inverting input and an output;

at least one programming circuit; and a feedback circuit coupled to the amplifier and the at least one programming circuit, the feedback circuit being programmed to one of a predetermined number of impedance values to provide a voltage ramp compensating for additional voltage caused by capacitive coupling effects experienced by the memory cell.

2. The voltage control circuit of claim 1, wherein the feedback circuit includes a feedback signal line having a first end connected to the inverting input of the amplifier and a second end connected to the output of the amplifier, feedback signal line includes a plurality of capacitors connected in parallel.

3. The voltage control circuit of claim 1, wherein the at least one programming circuit includes an inverter and a transmission gate.

4. The voltage control circuit of claim 3, wherein the at least one programming circuit to disconnect at least one capacitor of the plurality of capacitors from the second end of the feedback signal line in order to reduce the impedance of the feedback circuit.

5. The voltage control circuit of claim 2 further comprising a reset circuit connected to the feedback circuit, the reset circuit to discharge each of the plurality of capacitors connected to the first end and the second end of the feedback signal line.

6. The voltage control circuit of claim 1 further comprising a select circuit to provide an input ramp voltage to the inverting input of the amplifier and to cause a reduction in the ramp voltage in accordance with a compensation ratio between the ramp voltage and the input ramp voltage.

7. The voltage control circuit of claim 6, wherein the compensation ratio is equal to 2:x, where x is equal to an odd positive whole number greater than 3.

8. A system for enhancing cell programming accuracy, the system comprising:

a memory cell including a floating gate transistor having a drain receiving a first ramp voltage, a floating gate, a control gate and a source; and a voltage control circuit coupled to the control gate of the floating gate transistor, the voltage control circuit reduces a second voltage applied to the control gate in order to compensate for additional voltage caused by capacitive coupling effects between the drain having the first ramp voltage and the floating gate.

9. The system of claim 8, wherein the voltage control circuit includes an amplifier including an inverting input, a non-inverting input and an output coupled to the control gate of the floating gate transistor of the memory cell;

at least one programming circuit coupled to the amplifier; and a feedback circuit coupled to the amplifier and the at least one programming circuit, the feedback circuit being programmed by the at least one programming circuit to one of a predetermined number of impedance values to compensate for the capacitive coupling effects.

10. The system of claim 9, wherein the feedback circuit of the voltage control circuit includes a feedback signal line having a first end connected to the inverting input of the amplifier and a second end connected to the output of the amplifier, the feedback signal line includes a plurality of capacitors connected in parallel.

11. The system of claim 9, wherein the at least one programming circuit of the voltage control circuit includes an inverter and a transmission gate.

12. The system of claim 11, wherein the at least one programming circuit of the voltage control circuit to disconnect at least one capacitor of the plurality of capacitors from the second end of the feedback signal line in order to reduce the impedance of the feedback circuit.

13. The system of claim 9, wherein the voltage control circuit further including a reset circuit connected to the feedback circuit, the reset circuit to discharge each of the plurality of capacitors connected to the first end and the second end of the feedback signal line.

14. The system of claim 9, wherein the voltage control circuit further including a select circuit to provide the first ramp voltage to the inverting input of the amplifier when the first ramp voltage reaches a predetermined voltage, the first ramp voltage causes a reduction in the second ramp voltage at the output of the amplifier.

15. A method to accurately program a memory cell, the method comprising the steps of:

measuring an amount of additional voltage realized at a source of a floating gate transistor of the memory cell; and selecting a compensation ratio to reduce a ramp voltage applied to a control gate of the floating gate transistor in order to lessen the amount of additional voltage realized at the source of the floating gate transistor.

16. A floating gate analog storage device comprising:

a plurality of floating gate analog cells, each of the plurality of floating gate analog cells is programmable to store an analog value;

circuitry for programming each of the plurality of floating gate analog cells by a multi-iterative programming technique in which programming is accomplished by at least one coarse ramp pulse being terminated with respect to a particular analog cell when the analog cell reaches a desired coarse programming level, followed by at least one fine ramp pulse of increasing voltage amplitude, the fine ramp pulse being referenced by the at least one coarse ramp pulse and is terminated with respect to that analog cell when the analog cell reaches a desired fine programming level; and circuitry for programming, after fabrication of the floating gate analog storage device, a step down voltage from the at least one coarse ramp pulse to the at least one fine ramp pulse.

17. A system for enhancing cell programming accuracy, the system comprising:

a memory cell including a floating gate transistor having a drain, a floating gate, a control gate and a source; and a voltage control circuit coupled to the control gate of the floating gate transistor, the voltage control circuit including an amplifier including an inverting input, a non-inverting input and an output coupled to the control gate of the floating gate transistor of the memory cell, at least one programming circuit coupled to the amplifier, and a feedback circuit coupled to the amplifier and the at least one programming circuit, the feedback circuit including a feedback signal line having a first end connected to the inverting input of the amplifier and a second end connected to the output of the amplifier, the feedback signal line includes a plurality of capacitors connected in parallel.

18. A system for enhancing cell programming accuracy, the system comprising:

a memory cell including a floating gate transistor having a drain, a floating gate, a control gate and a source; and a voltage control circuit coupled to the control gate of the floating gate transistor, the voltage control circuit including an amplifier including an inverting input, a non-inverting input and an output coupled to the control gate of the floating gate transistor of the memory cell, at least one programming circuit coupled to the amplifier, the at least one programming circuit including an inverter and a transmission gate, and a feedback circuit coupled to the amplifier and the at least one programming circuit.

19. The system of claim 18, wherein the at least one programming circuit of the voltage control circuit, to disconnect at least one capacitor of the plurality of capacitors from the second end of the feedback signal line in order to reduce the impedance of the feedback circuit.

20. The system of claim 17, wherein the voltage control circuit further including a reset circuit connected to the feedback circuit, the reset circuit to discharge each of the plurality of capacitors connected to the first end and the second end of the feedback signal line.

21. The system of claim 17, wherein the voltage control circuit further including a select circuit to provide a first ramp voltage to the inverting input of the amplifier when the first ramp voltage reaches a predetermined voltage, the first ramp voltage causes a reduction in a second ramp voltage at the output of the amplifier.

* * * * *